(12) United States Patent
Tiruvuru et al.

(10) Patent No.: US 11,335,390 B1
(45) Date of Patent: May 17, 2022

(54) NEGATIVE WORD LINE BIASING FOR HIGH TEMPERATURE READ MARGIN IMPROVEMENT IN MRAM

(71) Applicant: DXCorr Design Inc., Sunnyvale, CA (US)

(72) Inventors: Rajesh Tiruvuru, Bangalore (IN); Manish Agarwal, Fagu (IN); Nirmalya Ghosh, Fremont, CA (US)

(73) Assignee: DXCorr Design Inc., Sunnyvale, CA (US)

(*) Notice: Subject to any disclaimer, the term of this patent is extended or adjusted under 35 U.S.C. 154(b) by 0 days.

(21) Appl. No.: 17/207,784

(22) Filed: Mar. 22, 2021

(51) Int. Cl.
| G11C 16/10 | (2006.01) |
| G11C 16/04 | (2006.01) |
| G11C 11/16 | (2006.01) |
| G11C 13/00 | (2006.01) |
| H01L 27/22 | (2006.01) |

(52) U.S. Cl.
CPC ...... *G11C 11/1657* (2013.01); *G11C 11/1673* (2013.01); *G11C 11/1697* (2013.01); *G11C 13/004* (2013.01); *H01L 27/228* (2013.01); *G11C 2213/79* (2013.01)

(58) Field of Classification Search
CPC ............ G11C 11/1657; G11C 11/1673; G11C 11/1697; G11C 13/004; G11C 2213/79; H01L 27/228
See application file for complete search history.

(56) References Cited

U.S. PATENT DOCUMENTS

| 2005/0105338 | A1* | 5/2005 | Sundaram | G11C 8/08 365/185.27 |
| 2007/0183185 | A1* | 8/2007 | Guo | H01L 27/11 257/E27.099 |
| 2013/0107627 | A1* | 5/2013 | Toyama | G11C 16/08 365/185.11 |
| 2014/0247644 | A1* | 9/2014 | Yang | G11C 13/0097 365/148 |
| 2017/0084339 | A1* | 3/2017 | Son | G11C 16/08 |

OTHER PUBLICATIONS

Ann Steffora Mutschler; The Return Of Body Biasing; Nov. 15, 2017; https://semiengineering.com/the-return-of-body-biasing/.

* cited by examiner

*Primary Examiner* — Hien N Nguyen
(74) *Attorney, Agent, or Firm* — Jason C. Cameron

(57) ABSTRACT

An electronic biasing circuit for memory operating in a high temperature environment, comprising a first memory cell and a second memory cell, a first MOSFET transistor electrically coupled in series with the first memory cell, wherein the first MOSFET transistor is configured as a switch, a second MOSFET transistor electrically coupled in series with the second memory cell, wherein the second MOSFET transistor is configured as a switch, a DC bias current source configured to generate a negative DC bias voltage signal, a first read/word line electrically coupled to a gate of the first MOSFET transistor, and a second read/word line electrically coupled to a gate of the second MOSFET transistor, wherein in response to a read operation of the first memory cell, the second read/word line is configured to deliver the negative DC bias voltage signal to the gate of the second MOSFET transistor.

20 Claims, 5 Drawing Sheets

NEGATIVE WORD LINE BIASING FOR HIGH TEMPERATURE READ MARGIN IMPROVEMENT IN MRAM

BACKGROUND

Embodiments of the present disclosure relate to transistor biasing, and more specifically, for MOSFET transistor biasing in a memory array in a high temperature environment.

Magnetoresistive random-access memory (MRAM) is a type of memory which stores data using electron spin to store bit information in a memory cell. MRAM storage has the advantages of high density, high speed, lower power usage, and non-volatility. A MRAM array is typically constructed using MOSFET transistor switches to access (read/write) each memory bit cell in the array. The memory array is configured in rows and columns of individual bit cells and is selected by activating the appropriate read/word lines, also known as a word line. A read operation is typically conducted by sensing the voltage drop across the bit cell resulting from applying a columnar reference current through the bit cell in a selected row. The word line is common to all columns in a row, which results in the columnar current being common to all of the rows in a particular column. When reading the bit cell in a given row, the MOSFET transistor switch in the row is on while the switches in the other rows of the array are off.

MOSFET transistors share the characteristic of having a sub-threshold (leakage) current present due to finite sub-threshold slope resulting in some (not zero) unwanted current. Furthermore, the off-state sub-threshold current increases exponentially with increasing temperatures. Therefore, the leakage currents of the off-state MOSFET transistors in the unselected rows tend to take (steal) a significant amount of reference current flowing into the bit cell of the selected row. This unwanted leakage current affects the read margin of the memory array at higher temperatures.

One known method to control the sub-threshold leakage current of MOSFET transistors is to apply a body bias ($V_{BB}$) to raise the threshold voltage of the transistor. While this is a good technique to achieve low degradation in the high-temperature read margin for MRAM, it has a number of limitations over the present disclosure as described herein. In large memories, the bulk diode reverse bias current is higher, and results in a high area and a high supply current for the negative bias voltage generators. For a similar amount of leakage current reduction, this approach ($V_{BB}$) causes the negative voltage to be pumped to larger levels. The problem is further worsened in bulk CMOS technology as compared to a FD-SOI technology. Lastly, the threshold voltage shift also affects the resistances of the switches in their on state.

Hence, there is a need for a correcting for unwanted leakage currents in unselected rows while reading a bit cell in a selected row while operating in a high temperature environment.

BRIEF DESCRIPTION

In accordance with an embodiment of the present disclosure, herein is described an electronic biasing circuit for memory operating in a high temperature environment, comprising a first memory cell and a second memory cell, a first MOSFET transistor electrically coupled in series with the first memory cell, where the first MOSFET transistor is configured as a switch, a second MOSFET transistor electrically coupled in series with the second memory cell, where the second MOSFET transistor is configured as a switch, a DC bias current source configured to generate a negative DC bias voltage signal, a first read/word line electrically coupled to a gate of the first MOSFET transistor, and a second read/word line electrically coupled to a gate of the second MOSFET transistor, where in response to a read operation of the first memory cell, the second read/word line is configured to deliver the negative DC bias voltage signal to the gate of the second MOSFET transistor, and where the high temperature environment is defined as a temperature above which the read margin degradation exceeds a predetermined limit. In some embodiments, the high temperature environment exists for temperatures above 70° C.

According to some embodiments, the circuit also includes a plurality of additional memory cells, a plurality of corresponding MOSFET transistors, and a plurality of corresponding read/word lines, where in response to a read operation of the first memory cell, the plurality of all other read/word lines are configured to deliver the negative DC bias voltage signal to the gates of the pluralities of corresponding MOSFET transistors. According to some embodiments, the circuit also includes where the negative DC bias voltage signal acts to minimize leakage current through the second memory cell during the read operation of the first memory cell. According to some embodiments, the circuit also includes where the negative DC bias voltage signal increases the magnitude of a read margin of the first memory cell. According to some embodiments, the negative voltage increases with increasing temperature, while in alternative embodiments, a different function is used to model the negative voltage increase in relation to temperature. According to some embodiments, the circuit also includes where the memory cell is a MRAM transistor. According to some embodiments, the circuit also includes where the memory cell is a Resistive Random Access Memory (RRAM) transistor. According to some embodiments, the circuit also includes where the memory cell is a Phase-Change Memory (PCM) cell. According to some embodiments, the circuit also includes where the first and second MOSFET transistors are p-type transistors. For p-type transistors, the resultant voltage is the additional voltage over the supply voltage that results in a boosted voltage. According to some embodiments, the circuit also includes where the first and second MOSFET transistors are n-type transistors. According to some embodiments, the circuit also includes where the first MOSFET transistor and the first memory cell are formed as part of a single integrated circuit.

In accordance with an embodiment of the present disclosure, herein is described a method of compensating for leakage current in an electronic circuit in a high temperature environment, comprising providing an array of memory cells, where each memory cell is associated with a MOSFET transistor and a read/word line, selecting, in the array of memory cells, a first memory cell for a read operation, where the first memory cell is associated with a first MOSFET transistor, and where the selection is comprised of activating the read/word line associated with the first memory cell, generating, from a DC bias current source, a negative DC bias voltage, and applying, to a gate of a second MOSFET transistor, the negative DC bias voltage, where the second MOSFET transistor is not selected for a read operation, and where the high temperature environment is defined as a temperature above which the read margin degradation exceeds a predetermined limit.

According to some embodiments, the method also includes providing a plurality of additional memory cells associated with a plurality of corresponding MOSFET transistors and a plurality of read/word lines, and applying, to gates of the plurality of MOSFET transistors that are not selected for a read operation, the negative DC bias voltage. According to some embodiments, the method also includes where the negative DC bias voltage signal acts to minimize leakage current through the second memory cell during the read operation of the first memory cell. According to some embodiments, the method also includes where the negative DC bias voltage signal increases the magnitude of a read margin of the first memory cell. According to some embodiments, the method also includes where the memory cell is a MRAM transistor. According to some embodiments, the method also includes where the memory cell is a RRAM transistor. According to some embodiments, the method also includes where the memory cell is a PCM cell. According to some embodiments, the method also includes where the first and second MOSFET transistors are p-type transistors. According to some embodiments, the method also includes where the first and second MOSFET transistors are n-type transistors. According to some embodiments, the method also includes where the first MOSFET transistor and the first memory cell are formed as part of a single integrated circuit.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or sub-systems or elements or structures or components preceded by "comprises . . . a" does not, without more constraints, preclude the existence of other devices, sub-systems, elements, structures, components, additional devices, additional sub-systems, additional elements, additional structures, or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

Figure 1:
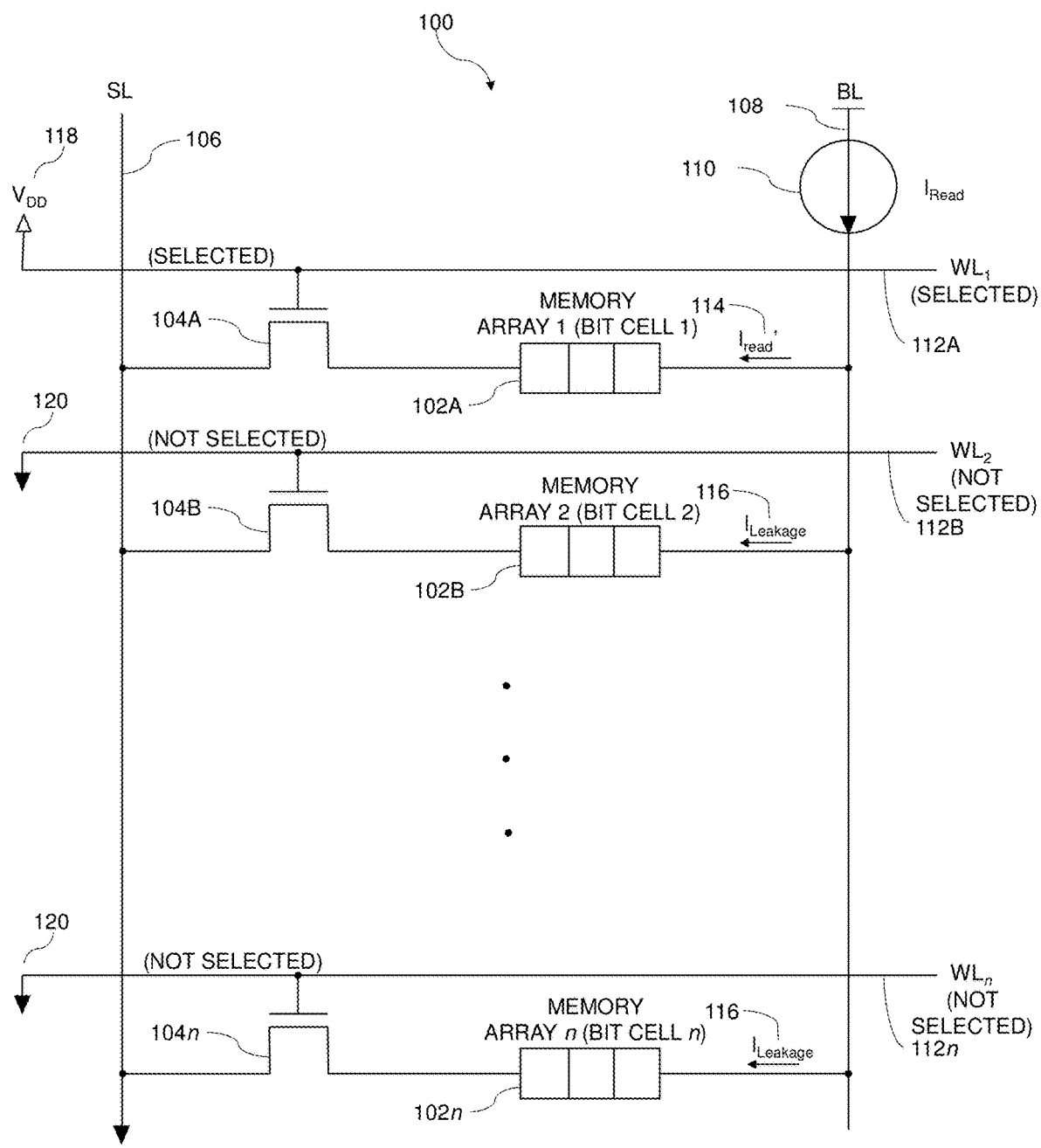
FIG. 1 is a schematic diagram of a memory array circuit showing the presence of leakage current during a read event in accordance with an embodiment of the present disclosure.

FIG. 1 is a schematic diagram of a memory array circuit 100 showing the presence of leakage current ($I_{Leakage}$) 116 during a read event in accordance with an embodiment of the present disclosure. Circuit 100 includes a first memory array (or bit cell) 102A connected serially with a MOSFET transistor 104A. The bit cell 102A is electrically connected to two signal rails bit line (BL) 108 and source line (SL) 106.

During a read operation, a current ($I_{Read}'$) 114 is generated by an $I_{Read}$ current source 110 which flows through the bit cell 102A whenever the MOSFET transistor 104A is "on". $I_{Read}'$ current 114 is defined as the $I_{Read}$ current 110 minus the sum of all leakage currents $I_{Leakage}$ 116 from all of the unselected rows. In these embodiments, the MOSFET transistor 104A acts as a switch when active or turned "on". The MOSFET transistor 104A is turned on when the word line ($WL_1$) 112A is selected. Thus, the circuit operates by selecting the $WL_1$ 112A and witnessing the $I_{Read}'$ current 114 through the bit cell 102A in order to determine the state of the bit cell 102A. Each bit cell 102 is aligned with a corresponding MOSFET transistor 104 and a WL 112 to form a single stage. FIG. 1 continues with additional stages to form a plurality of memory arrays. For example, FIG. 1 also discloses a second bit cell 102B, with a second MOSFET transistor 104B and a second $WL_2$ 112B. Additional stages are included and are represented by bit cell n 102n with corresponding MOSFET transistor 104n and $WL_n$ 112n.

MRAM memory arrays typically use MOSFET transistor switches for accessing bit cells. The read operation is typically performed by sensing the voltage across a MRAM bit cell by sending the column reference current through the bit cell in the selected row. While reading the bit cell in a row, the switch in the row is on and the switches in the other rows are off. Meanwhile, the read lines are common to all rows in a column.

In the example shown in FIG. 1, bit cell 1 102A has been selected for a read operation. This is accomplished by activating $WL_1$ 112A, which connects the gate of MOSFET transistor 104A to power supply $V_{DD}$ 118. Thus, turned on, MOSFET transistor 104A allows the $I_{Read}'$ current 114 to flow through bit cell 1 102A, where an external monitoring circuit can determine the state of bit cell 1 102A. At the same time, the read operation is being conducted for bit cell 1 102A, the other stages in the array are not selected for a read operation. Thus, $WL_2$ 112B through $WL_n$ 112n are tied to ground 120. As a result of the word lines not being selected, there is no $I_{Read}$ current flowing through the other bit cells. This condition places the unselected MOSFET transistors 104 in the "off-state". However, due to imperfections in the physical construction and the sub-threshold conduction of the MOSFET transistors 104, there is always some amount of $I_{Leakage}$ 116 flowing through each stage that is not selected.

One characteristic of $I_{Leakage}$ 116 is that the unwanted current increases with an increase of temperature; in other words, the $I_{Leakage}$ 116 shows a positive coefficient directly related to the ambient temperature in which circuit 100 operates. At relatively high temperatures of 70° C. and above, the $I_{Leakage}$ 116 current has a deleterious effect on accurately reading the state of bit cells 102 elsewhere in the circuit. As a result of the unwanted $I_{Leakage}$ 116 currents present in the circuit, the read margins are reduced. Therefore, the leakage current $I_{Leakage}$ 116 of the off-state transistors 104 in the unselected rows tend to steal a significant amount of reference current flowing into the bit cell 102 of the selected row, making it affect the read margins for the memory at higher temperatures.

The off-state leakage current $I_{Leakage}$ 116 can be reduced by applying a negative voltage to the gate terminal of the MPSFET transistor 104. Therefore, by applying an appropriate negative bias voltage to the word lines 112 of unselected rows of a MRAM array, the currents of the switches in the off-state can be kept in control. This results in the read margin degradation due to the leakage currents is reduced at higher temperatures when the leakage is high.

This disclosure applies to MRAM devices, but in some embodiments, can also be applied to Resistive RAM (RRAM), Phase-Change Memory (PCM), and the like. Also, according to some embodiments, the MOSFET transistors can be either p-type devices or n-type devices. For p-type transistors, instead of a negative bias voltage being applied to the gate of the MOSFET transistor, an additional positive voltage is applied to the gate (a boosted voltage). Also, according to some embodiments, circuit 100 can be a portion of a single integrated circuit, combining the memory, switching transistors, read/word lines, and the like.

Figure 2:
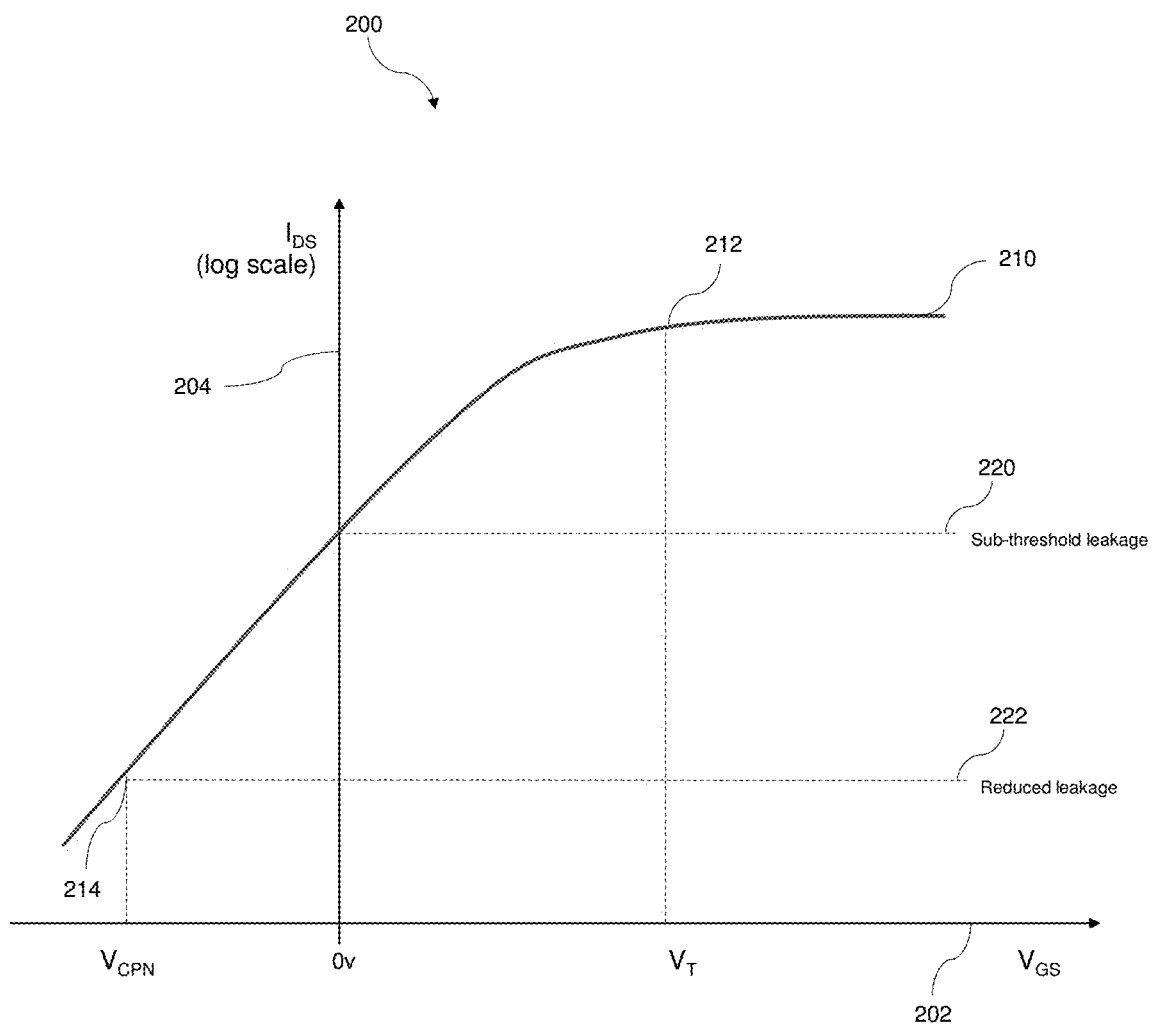
FIG. 2 illustrates a graph of $I_{DS}$-$V_{GS}$ characteristics of a MOSFET transistor in accordance with an embodiment of the present disclosure.

FIG. 2 illustrates a graph of $I_{DS}$-$V_{GS}$ characteristics plot 200 of a MOSFET transistor, such as 104A of FIG. 1 in accordance with an embodiment of the present disclosure. Plot 200 uses a graph with the x-axis 202 showing increasing gate-source voltage ($V_{GS}$) on a linear scale vs. the drain-source current ($I_{DS}$) plotted on the y-axis 204 using a logarithmic scale. At some arbitrary voltage $V_T$ 212, $I_{DS}$ is significantly a constant with increasing $V_{GS}$. The $I_{DS}$-$V_{GS}$ curve 210 also shows that, with a $V_{GS}$ equal to zero, the sub-threshold leakage current 220 is at a significant level. However, by applying a negative charge pump voltage $V_{CPN}$, the curve 210 shows, at point 214, a reduced leakage current 222 is indicated.

The $I_{DS}$-$V_{GS}$ curve 210 shows that the leakage current of a MOSFET transistor can be reduced by applying a negative voltage to the gate terminal. Therefore, by applying an appropriate negative bias voltage $V_{CPN}$ to the word lines, (such as $WL_2$-$WL_n$ 112B-112n of FIG. 1) of all unselected rows, the currents of the switches in the off state can be kept in control, and the read margin degradation of the first bit cell 102A is reduced.

Figure 3:
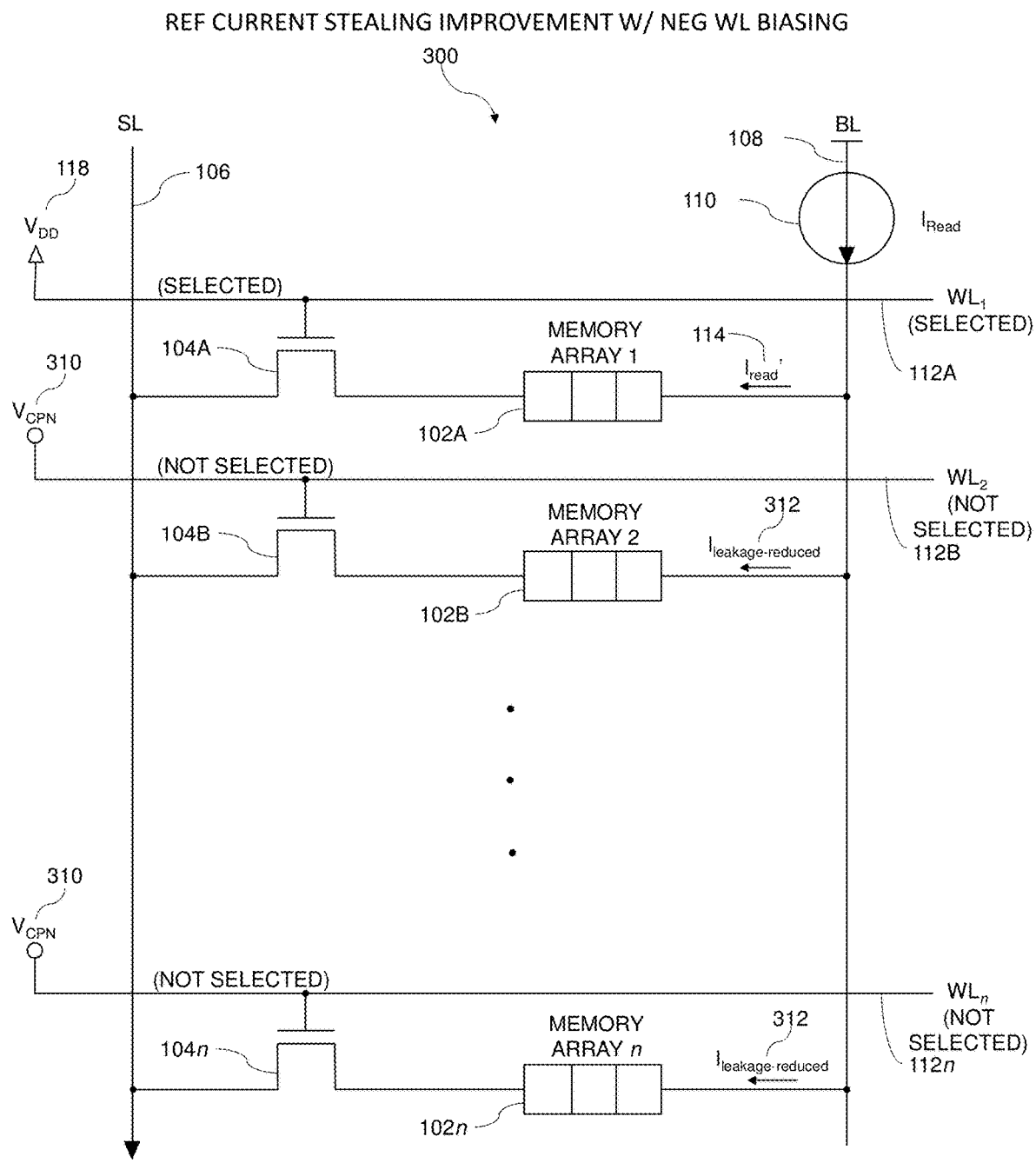
FIG. 3 is a schematic diagram of a memory array circuit having reduced leakage current in accordance with an embodiment of the present disclosure.

FIG. 3 is a schematic diagram of a memory array circuit 300 having reduced leakage current in accordance with an embodiment of the present disclosure. FIG. 3 shows the circuit 100 of FIG. 1 but with the addition of applying a negative DC bias voltage signal ($V_{CPN}$) 310 to the gate of each MOSFET transistors 104B-104n in accordance with the discussion use din FIGS. 1 and 2. In FIG. 1, the leakage current $I_{Leakage}$ 116 that flows through each bit cell 102B-102n, combines to reduce the read margin of the bit cell 102A being selected for a read operation. In the present embodiment of FIG. 3, the negative DC bias voltage signal ($V_{CPN}$) 310 is delivered to each gate of all unselected stages, specifically to each gate of each MOSFET transistor 104B-104n. As disclosed in FIG. 2, the addition of negative DC bias voltage signal ($V_{CPN}$) 310 to the MOSFET transistor has the effect of reducing leakage current $I_{Leakage-Reduced}$ 312 for each unselected stage in a high temperature environment. As a result, current stealing is reduced, and accuracy of the read operation is enhanced.

Figure 4:
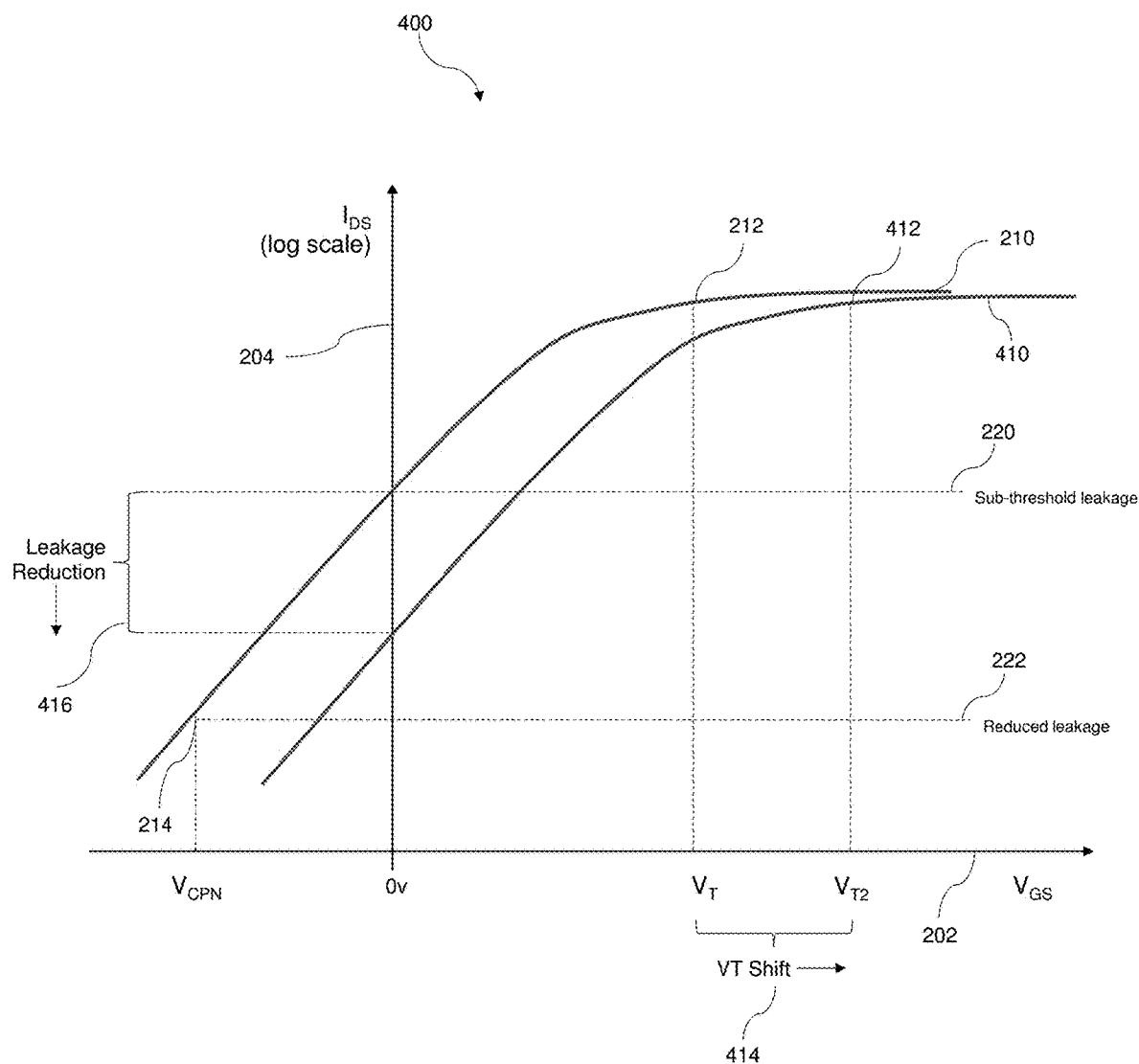
FIG. 4 illustrates existing technology and displays characteristics of prior art to include a graph of $I_{DS}$-$V_{GS}$ characteristics of a MOSFET transistor for different threshold voltages in accordance with an embodiment of the present disclosure.

FIG. 4 illustrates existing technology and displays characteristics of prior art to include a graph of $I_{DS}$-$V_{GS}$ characteristics plot 400 of a MOSFET transistor for different threshold voltages in accordance with an embodiment of the present disclosure. FIG. 4 discloses. By adjusting the $V_{BB}$ value, the original $I_{DS}$-$V_{GS}$ curve 210 shifts to the right to form a new $I_{DS}$-$V_{GS}$ curve 410. The shift of curve 410 also causes a change in $V_T$ values, from $V_T$ 212 to $V_{T2}$ 412. This change is shown as a $V_T$ shift 414 to the right of the chart 400. As a result of the $V_T$ shift 414, the sub-threshold leakage current 220 is reduced to point 416, which is shown graphically as a leakage current reduction.

Figure 5:
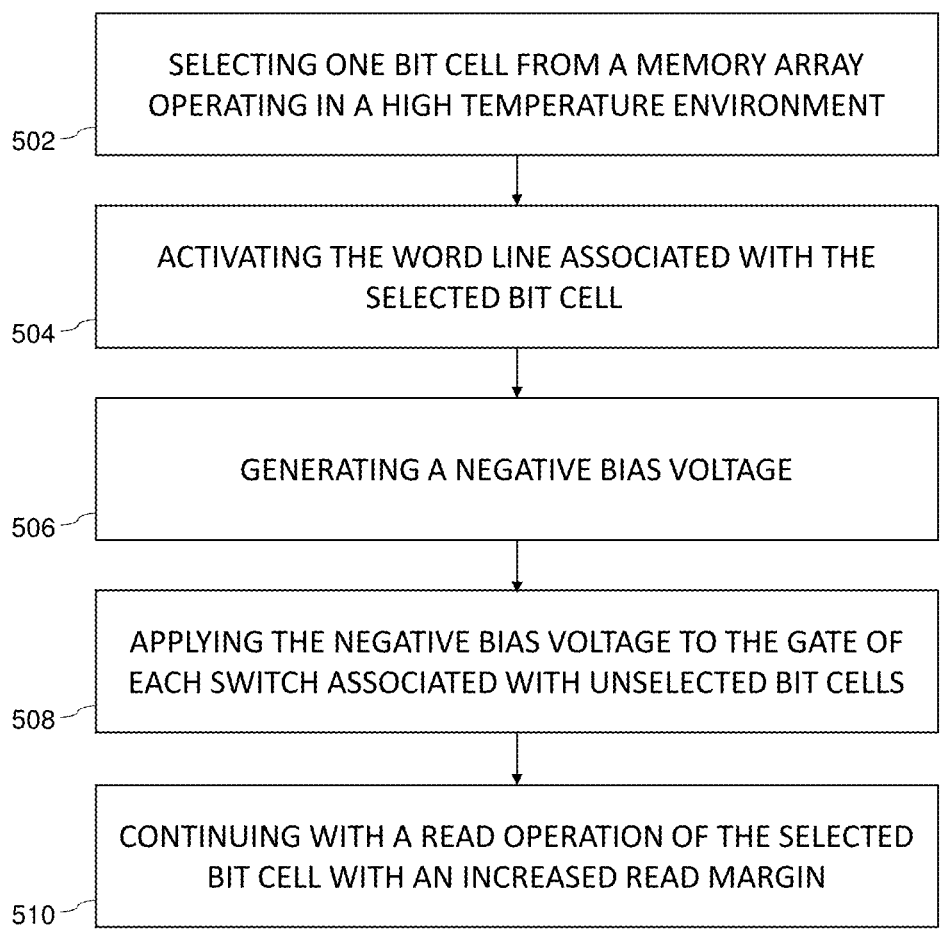
FIG. 5 discloses a method of improving read margins of a memory array in a high temperature environment in accordance with an embodiment of the present disclosure.

FIG. 5 discloses a method 500 of improving read margins of a memory array in a high temperature environment in accordance with an embodiment of the present disclosure. Method 500 begins at block 502, where, as part of a memory array operating in a high temperature environment, a single bit cell is selected to be read in a read operation. Next, the method continues at block 504 where the word line, such as $WL_1$ 1112A of FIG. 1, is selected. Next, at block 506, a negative bias voltage is generated to offset the adverse effects of leakage currents in unselected bit cells. Next, at block 508, the negative bias voltage is applied to the gates of every MOSFET transistor or switch of every unselected bit cell. Finally, at block 510, the read operation is conducted with the read current, such as $I_{Read}'$ 114 of FIG. 1, is measured and is less affected by the negative effects of the cumulative of all the individual leakage currents $I_{Leakage}$ 116 through each of the unselected bit cells.

It will be understood by those skilled in the art that the foregoing general description and the following detailed description are exemplary and explanatory of the disclosure and are not intended to be restrictive thereof.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

We claim:

1. An electronic biasing circuit for memory operating in a high temperature environment, comprising:
   a first memory cell and a second memory cell;
   a first MOSFET transistor electrically coupled in series with the first memory cell, wherein the first MOSFET transistor is configured as a switch;
   a second MOSFET transistor electrically coupled in series with the second memory cell, wherein the second MOSFET transistor is configured as a switch;
   a DC bias current source configured to generate a negative DC bias voltage signal;
   a first read/word line electrically coupled to a gate of the first MOSFET transistor; and
   a second read/word line electrically coupled to a gate of the second MOSFET transistor, wherein in response to a read operation of the first memory cell, the second read/word line is configured to deliver the negative DC bias voltage signal to the gate of the second MOSFET transistor, and
wherein the high temperature environment is defined as a temperature above which read margin degradation exceeds a predetermined limit.

2. The circuit of claim 1, further comprising:
   a plurality of additional memory cells;
   a plurality of corresponding MOSFET transistors; and
   a plurality of corresponding read/word lines, wherein in response to a read operation of the first memory cell, the plurality of all other read/word lines are configured to deliver the negative DC bias voltage signal to the gates of the pluralities of corresponding MOSFET transistors.

3. The circuit of claim 1, wherein the negative DC bias voltage signal acts to minimize leakage current through the second memory cell during the read operation of the first memory cell.

4. The circuit of claim 1, wherein the negative DC bias voltage signal increases the magnitude of a read margin of the first memory cell.

5. The circuit of claim 1, wherein the memory cell is a Magnetoresistive Random Access Memory (MRAM) transistor.

6. The circuit of claim 1, wherein the memory cell is a Resistive Random Access Memory (RRAM) transistor.

7. The circuit of claim 1, wherein the memory cell is a Phase-Change Memory (PCM) cell.

8. The circuit of claim 1, wherein the first and second MOSFET transistors are n-type transistors.

9. The circuit of claim 1, wherein the first and second MOSFET transistors are p-type transistors, and wherein an additional positive voltage is applied to the gate of the second MOSFET transistor.

10. The circuit of claim 1, wherein the first MOSFET transistor and the first memory cell are formed as part of a single integrated circuit.

11. A method of compensating for leakage current in an electronic circuit in a high temperature environment, comprising:
   providing an array of memory cells, wherein each memory cell is associated with a MOSFET transistor and a read/word line;
   selecting, in the array of memory cells, a first memory cell for a read operation, wherein the first memory cell is associated with a first MOSFET transistor, and wherein the selection is comprised of activating the read/word line associated with the first memory cell;
   generating, from a DC bias current source, a negative DC bias voltage; and
   applying, to a gate of a second MOSFET transistor, the negative DC bias voltage, wherein the second MOSFET transistor is not selected for a read operation, and wherein the high temperature environment is defined as a temperature above which read margin degradation exceeds a predetermined limit.

12. The method of claim 11, further comprising:
   providing a plurality of additional memory cells associated with a plurality of corresponding MOSFET transistors and a plurality of read/word lines; and
   applying, to gates of the plurality of MOSFET transistors that are not selected for a read operation, the negative DC bias voltage.

13. The method of claim 11, wherein the negative DC bias voltage signal acts to minimize leakage current through the second memory cell during the read operation of the first memory cell.

14. The method of claim 11, wherein the negative DC bias voltage signal increases the magnitude of a read margin of the first memory cell.

15. The method of claim 11, wherein the memory cell is a Magnetoresistive Random Access Memory (MRAM) transistor.

16. The method of claim 11, wherein the memory cell is a Resistive Random Access Memory (RRAM) transistor.

17. The method of claim 11, wherein the memory cell is a Phase-Change Memory (PCM) cell.

18. The method of claim 11, wherein the first and second MOSFET transistors are n-type transistors.

19. The method of claim 11, wherein the first and second MOSFET transistors are p-type transistors and wherein an additional positive voltage is applied to the gate of the second MOSFET transistor.

20. The method of claim 11, wherein the first MOSFET transistor and the first memory cell are formed as part of a single integrated circuit.

* * * * *